(12) United States Patent
Haddy

(10) Patent No.: US 9,568,529 B2
(45) Date of Patent: Feb. 14, 2017

(54) DUAL ORIENTATION BURIED ASSET LOCATOR DEVICE

(71) Applicant: Alan Haddy, Naples, FL (US)

(72) Inventor: Alan Haddy, Naples, FL (US)

(73) Assignee: IPEG CORPORATION, Naples, FL (US)

( * ) Notice: Subject to any disclaimer, the term of this patent is extended or adjusted under 35 U.S.C. 154(b) by 257 days.

(21) Appl. No.: 14/506,285

(22) Filed: Oct. 3, 2014

(65) Prior Publication Data

US 2016/0097873 A1    Apr. 7, 2016

(51) Int. Cl.
*G01V 3/08* (2006.01)
*G01R 31/02* (2006.01)
*G01V 3/17* (2006.01)

(52) U.S. Cl.
CPC ............. *G01R 31/021* (2013.01); *G01V 3/081* (2013.01); *G01V 3/17* (2013.01)

(58) Field of Classification Search
CPC ......... G01R 31/021; G01V 3/08; G01V 3/081; G01V 3/17
USPC .................................................. 324/326–329
See application file for complete search history.

(56) References Cited

U.S. PATENT DOCUMENTS

| 4,427,942 A | 1/1984 | Sole | |
| 4,529,937 A * | 7/1985 | Cornelius | G01V 3/15 15/143.1 |
| 5,798,644 A | 8/1998 | Eslambolchi | |
| 7,733,077 B1 * | 6/2010 | Merewether | G01V 3/104 324/326 |
| 8,106,660 B1 * | 1/2012 | Merewether | G01V 3/104 324/326 |

\* cited by examiner

*Primary Examiner* — Jay Patidar
(74) *Attorney, Agent, or Firm* — Mark Terry

(57) ABSTRACT

A locator device for generating buried asset data is disclosed. The device includes at least two sensing units pivotally attached to a central unit, each sensing unit comprising an elongated housing accommodating at least one sensor, wherein each sensor is for reading a plurality of analog signals from a buried asset, and wherein the sensing units can be pivoted from a first position to a second position. The locator further includes a position sensing device for sensing a position of the locator device, and a processor configured for applying a position filtering process to the analog signals based on the position of the device, converting the analog signals into a plurality of digital signals comprising buried asset data and a display unit for displaying the buried asset data in a graphical user interface.

6 Claims, 9 Drawing Sheets

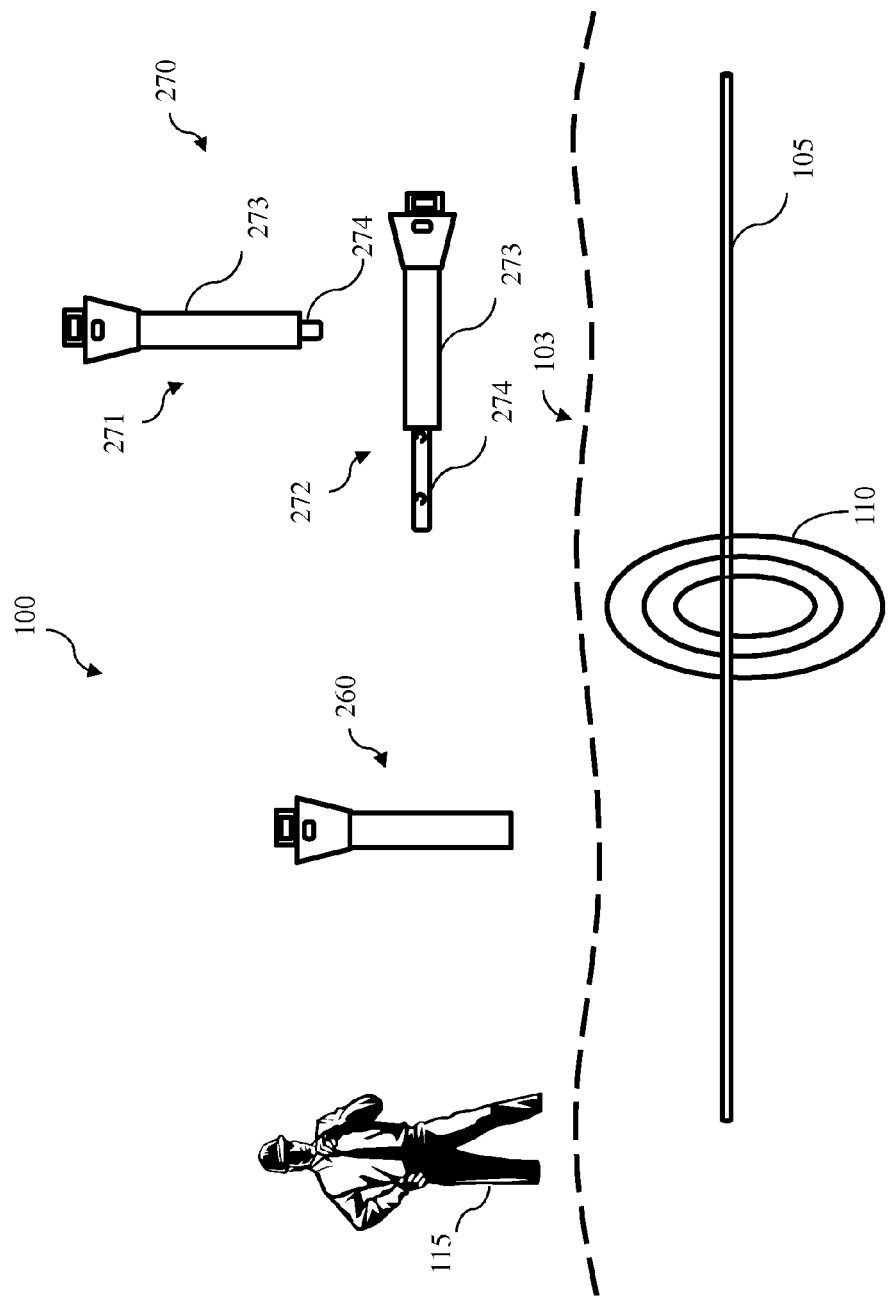

DUAL ORIENTATION BURIED ASSET LOCATOR DEVICE

CROSS-REFERENCE TO RELATED APPLICATIONS

Not Applicable

STATEMENT REGARDING FEDERALLY SPONSORED RESEARCH OR DEVELOPMENT

Not Applicable.

INCORPORATION BY REFERENCE OF MATERIAL SUBMITTED ON A COMPACT DISC

Not Applicable.

TECHNICAL FIELD

The technical field relates generally to the detection and identification of buried assets (i.e., underground utility lines) and, more specifically, to devices and processes for locating the depth and position orientation of buried cables.

BACKGROUND

Utility lines, such as lines for telephones, electricity distribution, natural gas, cable television, fiber optics, Internet, traffic lights, street lights, storm drains, water mains, and wastewater pipes, are often located underground. Utility lines are referred to as "buried assets" herein. Consequently, before excavation occurs in an area, especially an urban area, an excavator is typically required to clear excavation activities with the proper authorities. The clearance procedure usually includes contacting a central authority that in turn notifies the appropriate utility companies. Subsequently, each utility company must perform a buried asset detection procedure, which includes visiting the excavation site, detecting the relevant buried assets and physically marking the position orientation of the buried asset using temporary paint or flags. Upon completion of this procedure by the appropriate utility companies, excavation can occur with the security that buried assets will not be damaged.

Conventional locators (commonly known as "pipe or cable locator receivers") are portable, self-contained electronic devices carried by a field operator who walks over the target pipe or cable and receives an electromagnetic or acoustic signal from the buried conductor. A transmitter in the locator applies a signal to the buried asset. The locator includes detection antenna arrays, signal processing hardware and software, a display screen and power supply management circuits. The locator's display screen displays position, orientation and depth information of the buried asset to the operator.

Some prior art locators comprise portable upright or vertical profiles that use a receiver with at least two vertically separated antennas or sensors. This type of locator requires the operator to manually move the device across the above surface target area, searching for electromagnetic fields radiating from the underground conductor or buried asset. The operator then manually narrows the search area by moving the locator device through space so it is eventually positioned directly above the underground asset. Typically a peak or null response is presented to operator in visual or audible form. The vertical positioning of the sensors permit a depth calculation from the device to the target conductor. Once the target has been located, the operator can mark the position of the buried asset with a flag or paint marking device. Similarly, some prior art locators comprise portable horizontal bar profiles containing multiple separated antennas or sensors on a horizontal axis. As opposed to locators having vertically separated antennas or sensors, the horizontal type of locator is placed in a fixed stationary position above surface in an area believed to contain the buried asset. The horizontal bar type locator analyzes the signals directly under the device and remains in a static position while doing so. Complex vector algorithms predict the position of the buried asset relative to the horizontal bar's position and the user is presented with this data on a visual display. If no target is detected the operator is advised to reposition the device.

Both of these prior art devices have their advantages and disadvantages (speed, accuracy, operator skill requirements, cost, type of target conductor) and a variety of problems can result if both are not used to locate and accurately find the depth and position of a buried asset. Often two separate locaters—one horizontally oriented and one vertically oriented—are needed. Carrying around, maintaining and handling two, separate locator devices can be cumbersome and physically exhausting for a locate technician. Further, requiring two separate locator devices increases the complexity of the locating process, increases the associated costs (i.e., two locators must be purchased), and reduces reliability, since the malfunction of either locator leads to time lost. Further, it can be cost prohibitive for organizations that require large numbers of locators for their workforce to purchase the number of locators they require.

Therefore, a need exists for improvements over the prior art, and more particularly for methods and systems that increase the usability, reduce the complexity, and lower the costs of devices and systems that detect buried assets.

SUMMARY

A device and method for generating buried asset data is disclosed. This Summary is provided to introduce a selection of disclosed concepts in a simplified form that are further described below in the Detailed Description including the drawings provided. This Summary is not intended to identify key features or essential features of the claimed subject matter. Nor is this Summary intended to be used to limit the claimed subject matter's scope.

In one embodiment, the device includes a locator device for generating buried asset data comprising at least two sensing units pivotally attached to a central unit, each sensing unit comprising an elongated housing accommodating at least one sensor, wherein each sensor is for reading a plurality of analog radio frequency (RF) signals from a buried asset, and wherein the sensing units can be pivoted from a first position to a second position and from the second position to the first position, wherein in the first position the sensing units have at least two sensors having a known vertical distance between them, wherein in the second position the sensing units have at least two sensors having a known horizontal distance between them; a position sensing device for sensing a position of the locator device; and a processor communicatively coupled to the position sensing device and to each sensor of each sensing unit, the processor configured for: determining the position of the locator device; reading, via the sensors of the sensing units, a plurality of analog RF signals from the buried asset; applying a position filtering process to the analog RF signals based on the position; converting the analog RF signals into a plurality of digital signals comprising buried asset data corresponding to the buried asset, wherein the buried asset data includes depth data, position data and electrical current data for a buried asset; and, a display unit for displaying the buried asset data in a graphical user interface, wherein the buried asset data corresponds to the plurality of analog RF signals that were read.

In another embodiment, the device includes an elongated housing accommodating at least two sensors, wherein each sensor is for reading a plurality of analog radio frequency (RF) signals from a buried asset, wherein the at least two sensors having a known distance between them, and wherein the housing may be oriented either horizontally or vertically; a sensing device for sensing an orientation of the elongated housing; and a processor communicatively coupled to the sensing device and to each sensor, the processor configured for: determining the orientation of the elongated housing; reading, via the sensors, a plurality of analog RF signals from the buried asset; applying an orientation filtering process to the analog RF signals based on the orientation; converting the analog RF signals into a plurality of digital signals comprising buried asset data corresponding to the buried asset, wherein the buried asset data includes depth data, position data and electrical current data for a buried asset; and, a display unit for displaying the buried asset data in a graphical user interface, wherein the buried asset data corresponds to the plurality of analog RF signals that were read.

In another embodiment, the device includes a first elongated housing accommodating at least one sensor, and a second elongated housing accommodating at least one sensor, wherein each sensor is for reading a plurality of analog radio frequency (RF) signals from a buried asset, wherein the second elongated housing is designed for at least partial placement within the first elongated housing, and wherein the second elongated housing may extend a predefined length out of the first elongated housing, wherein in a first position the second elongated housing is at least partially located within the first elongated housing and in the first position the at least one sensor of the first elongated housing has a first predefined distance to the at least one sensor of the second elongated housing, wherein in a second position the second elongated housing extends the predefined length out of the first elongated housing and in the second position the at least one sensor of the first elongated housing has a second predefined distance to the at least one sensor of the second elongated housing; a sensing device for sensing an orientation of the locator device; and a processor communicatively coupled to the sensing device and to each sensor, the processor configured for: determining the orientation of the locator device; reading, via the sensors, a plurality of analog RF signals from the buried asset; applying an orientation filtering process to the analog RF signals based on the orientation; converting the analog RF signals into a plurality of digital signals comprising buried asset data corresponding to the buried asset, wherein the buried asset data includes depth data, position data and electrical current data for a buried asset; and, a display unit for displaying the buried asset data in a graphical user interface, wherein the buried asset data corresponds to the plurality of analog RF signals that were read.

In another embodiment, a method on a locator device for generating buried asset data is disclosed, wherein the locator device comprising at least two sensing units pivotally attached to a central unit housing a processor, each sensing unit comprising an elongated housing accommodating at least one sensor, wherein each sensor is for reading a plurality of analog radio frequency (RF) signals from a buried asset, wherein the sensing units can be pivoted from a first position to a second position and from the second position to the first position, the locator device further comprising a position sensing device for sensing a position of the device, the method comprising: determining, by the processor, the position of the locator device; reading, by the processor, via the sensors of the sensing units, a plurality of analog RF signals from the buried asset; applying, by the processor, a position filtering process to the analog RF signals based on the position; converting, by the processor, the analog RF signals into a plurality of digital signals comprising buried asset data corresponding to the buried asset, wherein the buried asset data includes depth data, position data and electrical current data for a buried asset; and, displaying, by the processor, the buried asset data in a graphical user interface of a display, wherein the buried asset data corresponds to the plurality of analog RF signals that were read.

BRIEF DESCRIPTION OF THE DRAWINGS

The subject matter, which is regarded as the invention, is particularly pointed out and distinctly claimed in the claims at the conclusion of the specification. The foregoing and other features and also the advantages of the invention will be apparent from the following detailed description taken in conjunction with the accompanying drawings. Additionally, the left most digit of a reference number identifies the drawing in which the reference number first appears. The accompanying drawings, which are incorporated in and constitute a part of this disclosure, illustrate various example embodiments. In the drawings:

FIG. 2B is an illustration of a front view of additional example embodiments of a device and process for generating buried asset data, wherein the devices operate in first and second positions or orientations;

DETAILED DESCRIPTION

Figure 1:
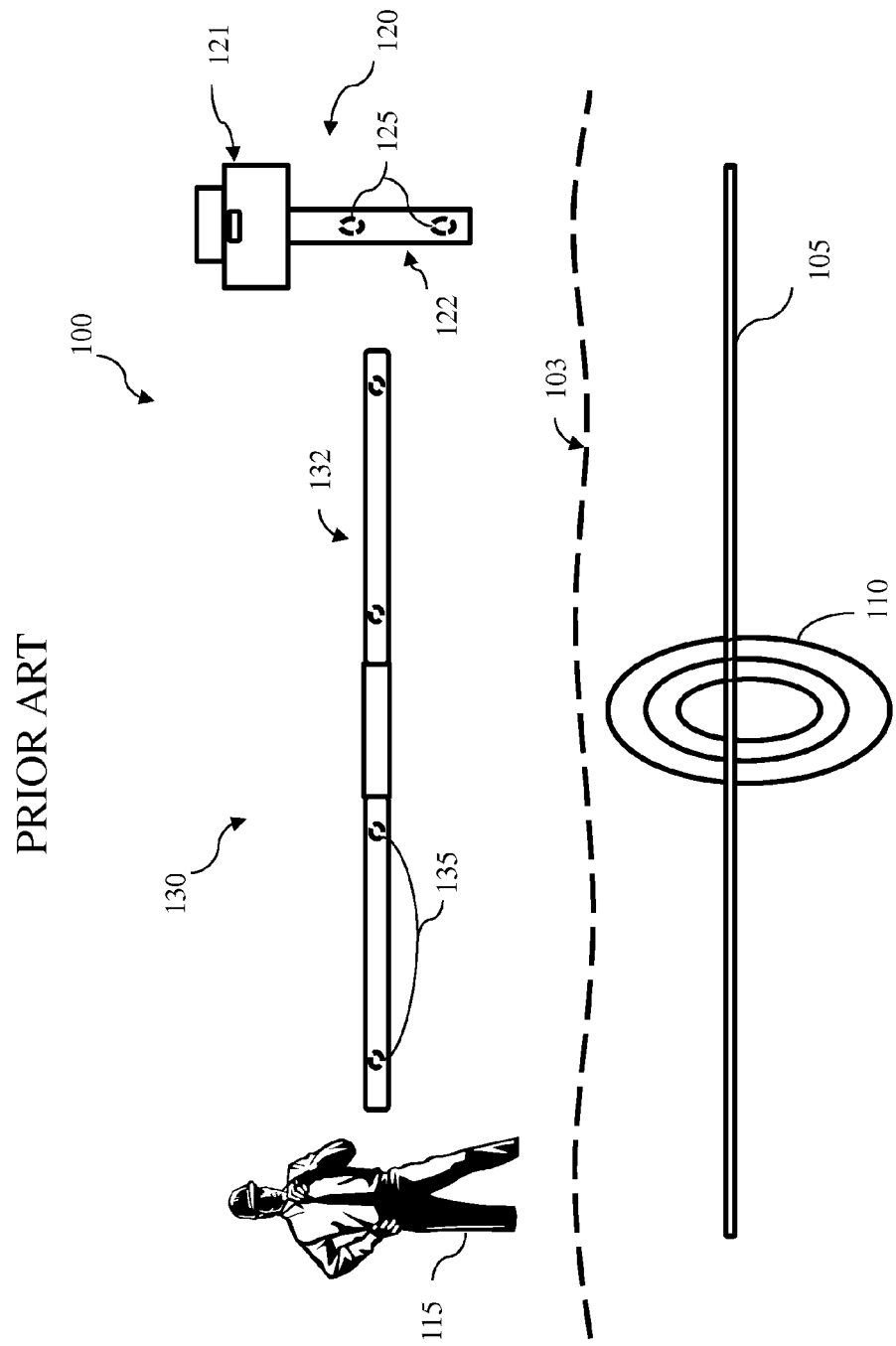
FIG. 1 is a diagram of the prior art device and process for generating buried asset data, according to an example embodiment.

The following detailed description refers to the accompanying drawings. Wherever possible, the same reference numbers are used in the drawings and the following description to refer to the same or similar elements. While embodiments of the invention may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the invention. Instead, the proper scope of the invention is defined by the appended claims.

The disclosed embodiments improve over the prior art by providing a single locator device that performs the functions of two conventional locator devices, thereby providing higher performance while lowering the cost of buried asset detection devices and systems. The integration of the functionality of two conventional locator devices into one novel locator device allows for the consolidation of sensors, signal processing and power management circuits needed to perform a locate procedure. This decreases the complexity and weight of the computing devices required by a locate technician when performing a locate procedure. The features of the disclosed embodiments further decrease the cost of manufacturing of the novel locator device (as opposed to the two conventional locator devices), increases reliability of the system utilized to perform a locate procedure and consequently decreases the cost of the system used to perform the locate procedure. The integration also affords the field technician the benefits of both locate devices in one system. As a result, the disclosed embodiments lower the cost while improving locate performance to companies using pipe and cable locator devices.

FIG. 1 is a diagram of the prior art device and process for generating buried asset data, according to an example embodiment. FIG. 1 illustrates a buried asset, such as an underground fiber-optic cable or electrical cable 105 having signals 110 emanating from it. These raw analog signals may include radio frequency (RF) signals, magnetic field readings, or the like. Each buried asset may be defined by its depth, electrical signal measurement (such as current, resistance, impedance, magnitude, frequency, voltage, etc.), direction and orientation. The environment 100 shows a technician 115 capable of operating two prior art devices 130, 120 for detection and collection of buried asset data.

Vertically oriented prior art device 120 has a central unit 121 above an elongated member 122 having a plurality of sensors 125 located vertically along or within the elongated member 122. As is well known in the prior art, the technician can acquire depth measurements and buried asset data of the buried asset 105 using device 120. Device 120 can be walked above ground 103 at the surface until the buried asset's signal is intercepted. The receiver is then repositioned directly over the underground asset and buried asset data is collected.

Horizontally oriented prior art device 130 can also be used to acquire buried asset data of buried asset 105. Device 130 has an elongated bar shaped member 132 having at least two horizontally separated antennas or sensors 135. Similar to locators having vertically separated antennas or sensors, device 130 is placed above surface 103 so the buried assets' signal 110 is intercepted. Device 130 can also be repositioned directly over the underground asset to collect buried asset data.

Figure 2A:
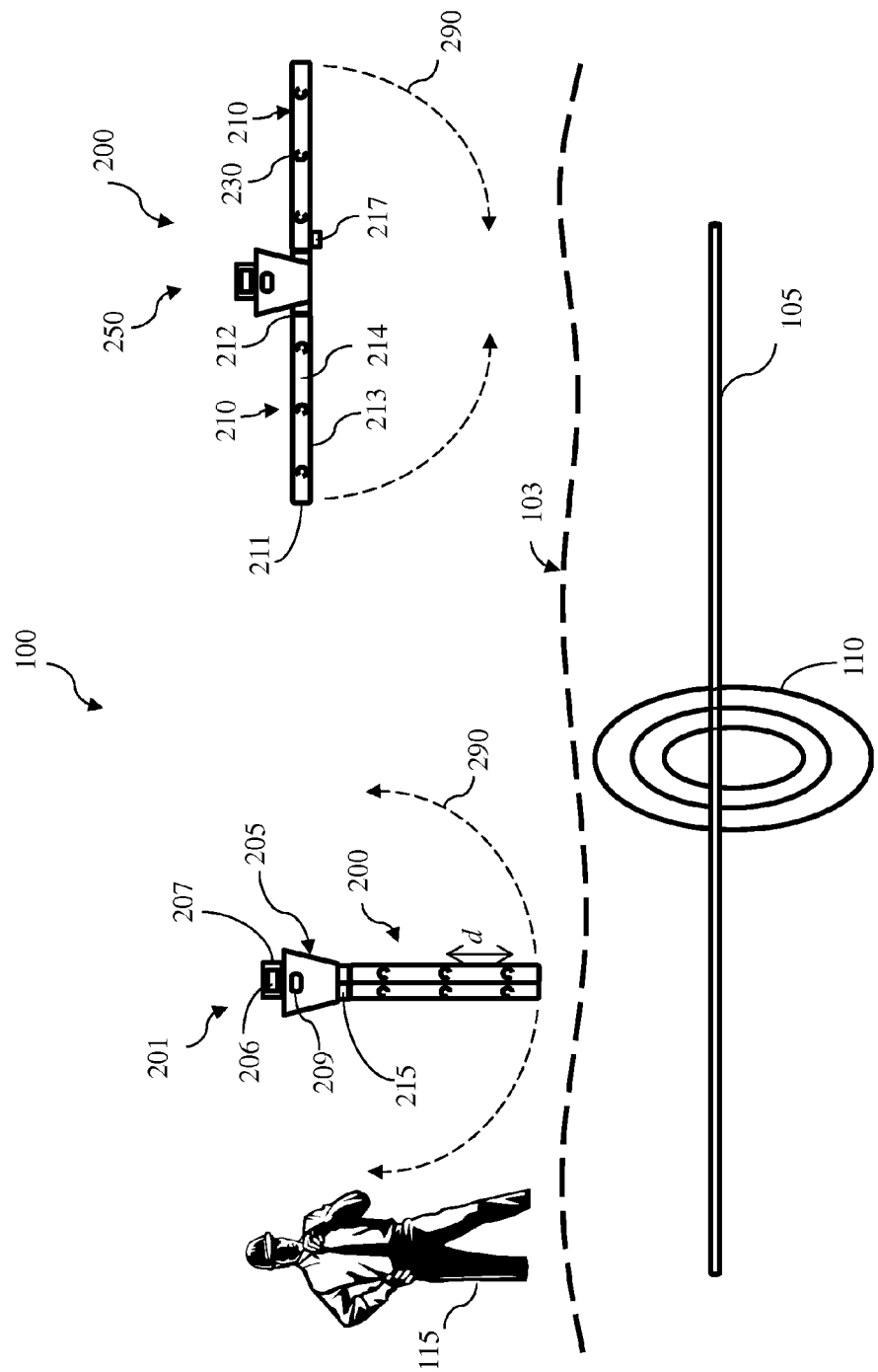
FIG. 2A is an illustration of a front view of one example embodiment of a device and process for generating buried asset data, wherein the device operates in a first position and a second position.

FIG. 2A is an illustration of a front view of one example embodiment of a device 200 and process for generating buried asset data, wherein the device operates in a first position 201 and a second position 250. In both positions 201, 250 the device has multiple sensing units 210 pivotally attached to a central unit 205, comprising a housing that may include a processor that executes program logic comprising computer source code, scripting language code or interpreted language code that perform various functions of the disclosed embodiments. In one embodiment, the aforementioned program logic may comprise program module 707 in FIG. 7.

In one non-limiting embodiment, each sensing unit defines an elongated bar shaped housing 214 having a first end 212 opposing a second end 211 and a side wall 213 spanning from the first end to the second end. Each sensing unit accommodates at least one sensor 230 communicatively coupled to the processor. In one embodiment, three sensors or antennas 230 are used on each sensing unit. In this embodiment, the sensors are disposed inside the housing, however, in other embodiments they may be attached to the outside of the housing (not shown). The housing of each sensing unit may be formed from material, such as fiberglass, plastic or aluminum, which does not affect detection of signals 110. The sensors form an antenna array. Each sensor 230 is separated apart at know distances d. The antennas separation distance is used in calculating the depth and position data of the buried asset 105 based upon established algorithms. Each sensor is configured for reading the plurality of analog signals 110 of the buried asset 105.

The central unit 205 may be a substantially box-shaped housing. However, other shapes and sizes adapted for purposes outlined below may be used. The housing may include a handle 209 defining a shape adapted for the technician to carry and operate the device. The housing may further include a display unit 207 having a graphical user interface 206 (further described in FIG. 6) for displaying human readable data. The first end 212 of the housing of each sensing unit 210 is pivotally or hingedly attached to the housing of the central processing unit by a hinging member 215. The hinging member is adapted to allow the sensing units to be pivoted from a vertical position or first position 201 to a horizontal position or second position 250 and vice versa. The device also includes a locking mechanism (not shown) that allows the technician or user to lock and unlock the device into the first and second positions. The locking mechanism can be a tongue and groove lock, a screw lock, bolt lock etc. Similar to the housing of the sensing units, the hinging member 215 and housing 205 are formed from material that that does not interfere with the detection of signals emanating from buried assets.

In the present embodiment, in the first position 201, the side walls 213 of the housing of the sensing units are oriented vertically and next to one another below the central unit 205. This allows the device to have at least two sensors having a known vertical distance between them. As a result, the analog RF signal received by each sensor when operated over a buried asset can be used to differentially calculate the distance to the buried asset.

In the second position 250, the side walls of the housings of the sensing units are oriented horizontally and collinear, and on opposite sides of the central unit 205. In this embodiment, the sensing units are linearly aligned and substantially parallel to the surface of the ground 103. This configuration allows the device to have at least three sensors having a known horizontal distance between them. As a result, algorithms can process the analog RF signal received by each sensor and triangulate the position, depth and signal current of the buried asset.

The hinging member allows the ends 211 of the sensing units to pivot from the first position to the second position and vice versa along the imaginary curved line 290. As mentioned above, the device may also include a locking mechanism (not shown) that locks the sensing units into the vertical (first position) and horizontal positions (second position). The device also includes a position sensing device 217 that is configured to detect whether the device is in a first or second position. In the present embodiment, position sensing device 217 is a button. In the present embodiment, when the device is in the first position 201 the button is depressed signaling that the device is in the first position or configuration. When in the second position 250, the button is not depressed and the position sensing device signals that the device is in the second position. In another embodiment (not shown), the position sensing device may comprise a tilt sensor, such as an accelerometer, that detects whether the sensing units are substantially vertically or horizontally positioned. The tilt sensor senses the position of each sensing unit and sends signals that correspond to the position of the device. As further explained in FIGS. 3-5, after the position of the device is detected, processes can be applied to facilitate calculating buried asset data.

FIG. 2B is an illustration of a front view of additional example embodiments of a device and process for generating buried asset data, wherein the devices operate in first and second positions or orientations. In one embodiment, the device 260 includes an elongated housing 261 that includes two or more sensors or antennas having a known distance d between them. The device 260 also includes an orientation sensing device that detects the orientation of the device, such as vertical or horizontal orientation. The orientation sensing device may include a tilt sensor or a button, as described above. As such, the device 260 may be used to collect buried asset data in both a vertical and horizontal orientation. As further explained in FIGS. 3-5, after the orientation of the device is detected, processes can be applied to facilitate calculating buried asset data.

Figure 3:
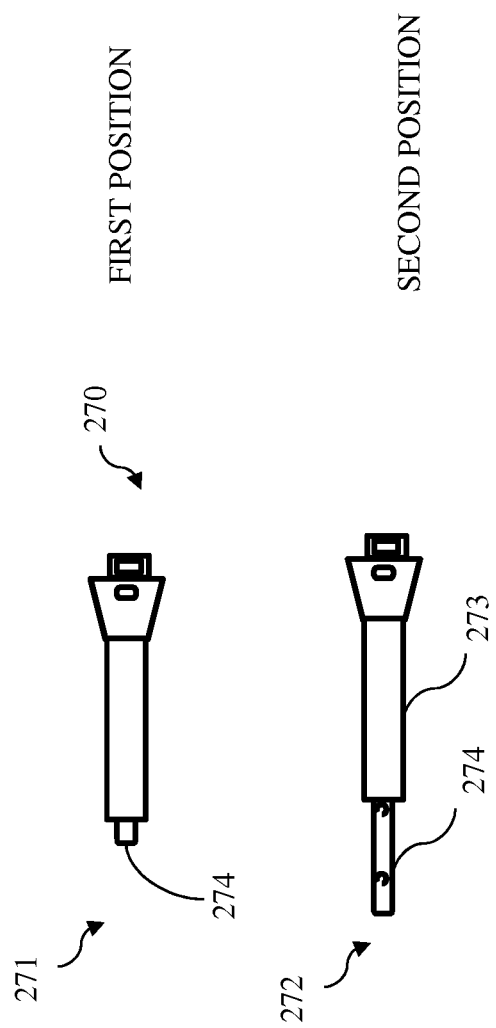
FIG. 3 is an illustration showing example embodiments of a device for generating buried asset data, wherein the device operates in first and second positions or orientations.

In another embodiment, a device 270 includes a first elongated housing 273 accommodating at least one sensor, and a second elongated housing 274 accommodating at least one sensor. The second elongated housing 274 is designed for at least partial placement within the first elongated housing, wherein the second elongated housing may extend a predefined length out of the first elongated housing. I.e., the second elongated housing may telescopically slide out of the first elongated housing. In a first position 271 (intended for use vertically) the second elongated housing 274 is at least partially located within the first elongated housing 273 and in the first position the at least one sensor of the first elongated housing has a first predefined distance to the at least one sensor of the second elongated housing. In the second position 272 (intended for use horizontally) the second elongated housing 274 extends the predefined length out of the first elongated housing 273 and in the second position the at least one sensor of the first elongated housing has a second predefined distance to the at least one sensor of the second elongated housing. The first predefined distance may be different from the second predefined distance. FIG. 3 shows the first and second positions (271, 272) of the device 270 in greater detail.

The device 270 also includes an orientation sensing device that detects the orientation of the device, such as vertical or horizontal orientation. The orientation sensing device may include a tilt sensor or a button, as described above. The device 270 may also include a position sensing device that detects the position (271 or 272) of the device. As such, the device 270 may be used to collect buried asset data in both a vertical and horizontal orientation. As further explained in FIGS. 3-5, after the orientation (and/or position) of the device is detected, processes can be applied to facilitate calculating buried asset data.

Figure 4:
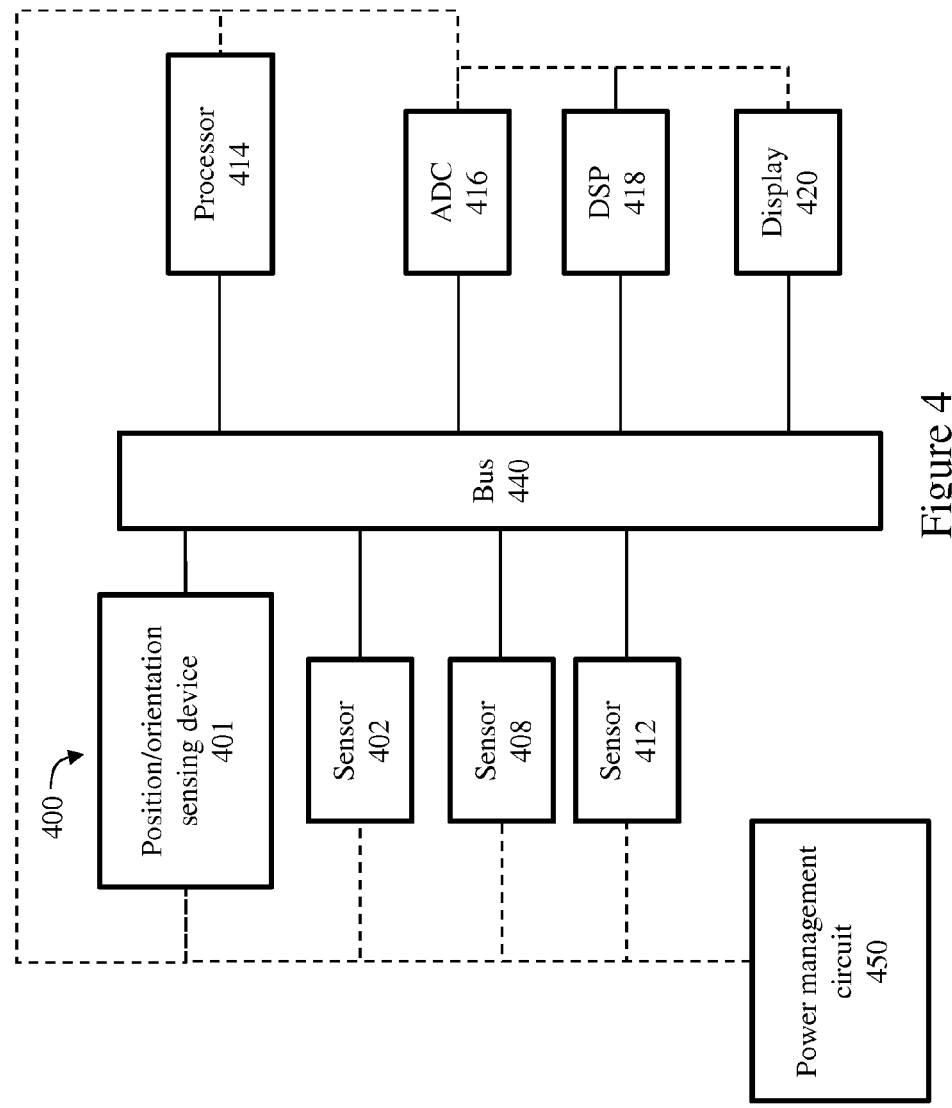
FIG. 4 is a block diagram showing the components of a device for generating buried asset data, according to an example embodiment.

FIG. 4 is a block diagram showing the components of a device 400 for generating buried asset data, according to an example embodiment. The device 400 corresponds to the devices 200, 260 and 270 for collecting buried asset data. FIG. 4 illustrates that the device 400 includes a processor 414 (see FIG. 7 for a more detailed explanation of said processor) and position or orientation sensing device 401 for sensing the position of the device. FIG. 4 also illustrates three sensors or antennas 402, 408, 412 (though the disclosed embodiments support any number of sensors). FIG. 4 also illustrates an analog to digital convertor module (ADC) 416, which is a device that converts analog signals to digital form, and a digital signal processor (DSP) 418 that performs digital signal processing on digitally formatted data. FIG. 4 also illustrates a screen or other display 420 for displaying buried asset data.

All components 401, 402, 408, 412, 414, 416, 418, 420 may be communicatively coupled via a communications bus 440. A communications bus is a communication system that transfers data between components inside a computing device. All components 401, 402, 408, 412, 414, 416, 418, 420 may also be communicatively coupled to a power management circuit or integrated circuit 450. A power management integrated circuit is an integrated circuit (or a system block in a system-on-a-chip device) for managing power requirements of the host system.

Processor 414 may perform a preliminary process (also referred to as pre-processing herein) on signals collected from a buried asset, wherein the preliminary process corresponds to the position or orientation of the device. The preliminary process may first determine the current position or orientation of the device 200, 260, 270. For device 200, the preliminary process may first determine whether the device 200 is in the first or second position 201, 250. For device 260, the preliminary process may determine whether the device 260 is oriented horizontally or vertically. For device 270, the preliminary process may determine whether the device 270 is in the first or second position 271, 272 and/or whether the device 270 is oriented horizontally or vertically. Since the preliminary process takes the position and/or orientation of the device 200, 260 or 270 into account when processing collected data, the preliminary process, or a subset thereof, may be referred to as a position filtering process or an orientation filtering process, or both.

The purpose of the position filtering process is to take the position and/or orientation of the locator device into account when making locator calculations later on, such as the ADC and DSP processes described below. For example, when the device 270 is retracted (position 271) and vertical, the ADC and DSP processes that are executed may be different from the ADC and DSP processes that are executed when the device 270 is elongated (position 272) and horizontal.

Subsequently, the preliminary process may take into account the distance separating each sensor in each device. For example, for device 200, the preliminary process takes into account the distance (see d in FIG. 2A) between each antenna or sensor (see 230 in FIG. 2A). For devices 260 and 270, the preliminary process is also adapted to depend on the distance separating each antenna or sensor. The preliminary process may be implemented fully in computer program logic or software.

In one embodiment, the preliminary process may also include pre-amplification processes, signal filtering processes, amplification processes or any combination of the above. A pre-amplification process may be a preamplifier (or "preamp"), which is an electronic amplifier that prepares a small signal for further amplification or processing. A pre-amplification process may alternatively be implemented fully in computer program logic or software. A signal filtering process removes unwanted components, such as noise or interfering signals. A signal filtering processing may be implemented by a dedicated circuit. An amplification process increases the amplitude of a small signal for further processing. An amplification process may also be implemented by a dedicated circuit.

ADC 416 converts raw analog RF signals into digital form by an analog to digital converter (ADC) process, which may be implemented by an electronic circuit that converts continuous signals to discrete digital numbers. The ADC process may alternatively be implemented fully in computer program logic or software. Subsequently, the digital form of the signals may undergo digital signal processing (DSP) via DSP 418, which may be performed by a specialized microprocessor with an architecture optimized for digital signal processing. The DSP process may alternatively be implemented fully in computer program logic or software. In one embodiment, the DSP 418 may comprise a DSP quadrature mixer resulting in a sum and difference representation of an input data signals. Consequently, the DSP process filters the data signal to remove the sum components and rectangular to polar conversion produces a magnitude and phase representation of the original input signal.

In addition to performing the preliminary process and initiating and controlling the ADC to and DESP processes, the processor 414 may perform additional processing on data collected from a buried asset so as to generate buried asset data, as defined below.

Figure 5:
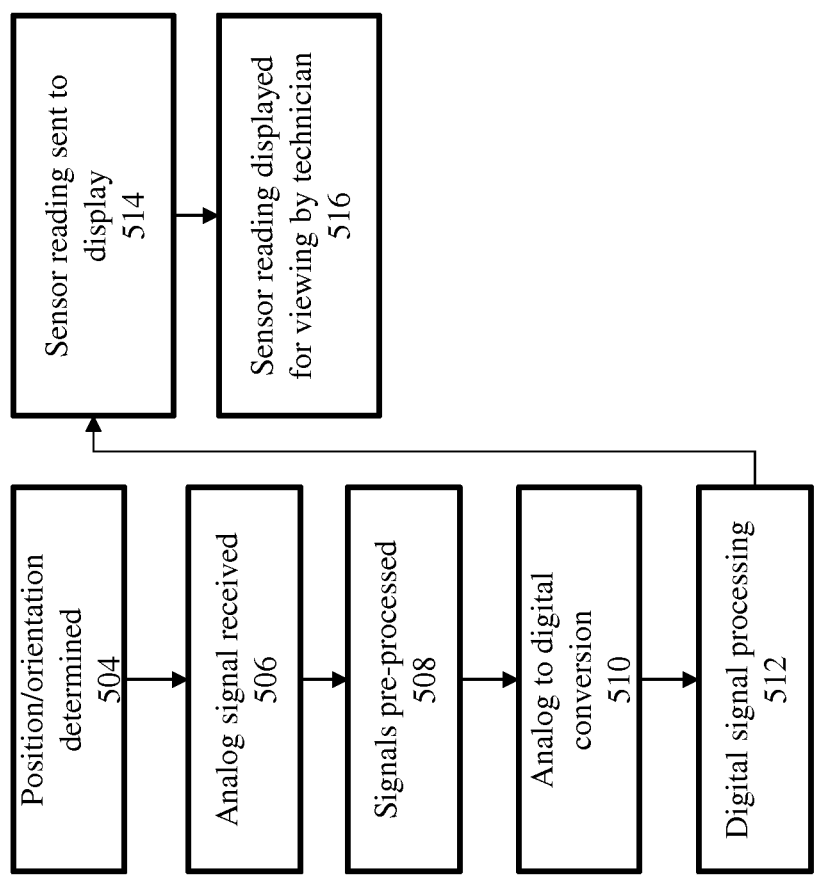
FIG. 5 is a flow chart showing the control flow of the process for generating buried asset data, according to an example embodiment.

FIG. 5 is a flow chart showing the control flow of the process for generating buried asset data, according to an example embodiment. Process 500 describes the steps that occur when a technician 105 visits a proposed a site (such as an excavation site) and utilizes a device (such as 200, 260, 270) to perform standard buried asset detection procedures. The process 500 is described with reference to the figures above.

Process 500 starts with step 504, wherein a position/orientation sensing device 401 receives at least one device position/orientation signal that is based upon or corresponding to the orientation or position of the device. Then in step 506, the sensors receive raw analog RF signals (110 from FIG. 1) emanating from a buried asset 105. Next, in step 508, the raw signals are pre-processed or preliminarily processed in such as way that corresponds to the position or orientation of the device (see step 504), as well as the known distances d between sensors. For example, if the device is determined to be in a horizontal orientation, the raw signals are processed in such a way that assumes the sensors are arranged horizontally, collinearly, and substantially parallel to the ground that includes the buried asset, for the known distances d between sensors. In another example, if the device is determined to be in a vertical orientation, the raw signals are processed in such a way that assumes the sensors are arranged vertically, collinearly, and substantially perpendicular to the ground that includes the buried asset, for the known distances d between sensors. In another example, if the device 200 is determined to be in the first position 201, the side walls 213 of the housing of the sensing units are oriented vertically and next to one another below the central unit 205. In another example, if the device 200 is determined to be in the second position 250, the side walls of the housings of the sensing units are oriented horizontally and collinear, and on opposite sides of the central unit 205.

Then, in step 510, the ADC 416 converts the processed signals into digital form. Next, optionally, in step 512, the digital signal processor 418 performs digital signal processing upon the digitized signals. In step 514, the final result of the digital signal processing, which is a sensor reading or human readable data comprising of buried asset data, is sent to a display unit 420. Subsequently, in step 516, the device displays the human readable data on a display screen 420 for the technician to view.

In one embodiment, the device 200 may also include modules capable of calculating its current position using a Global Positioning System (GPS) receiver, which is a navigation device that receives GPS signals for the purpose of determining the device's current position on Earth. A GPS receiver, and its accompanying processor, may calculate latitude, longitude and altitude information. In this embodiment, a radio frequency signal is received from a GPS transmitter (such as a satellite) comprising a time the signal was transmitted and a position of the transmitter.

Figure 6A:
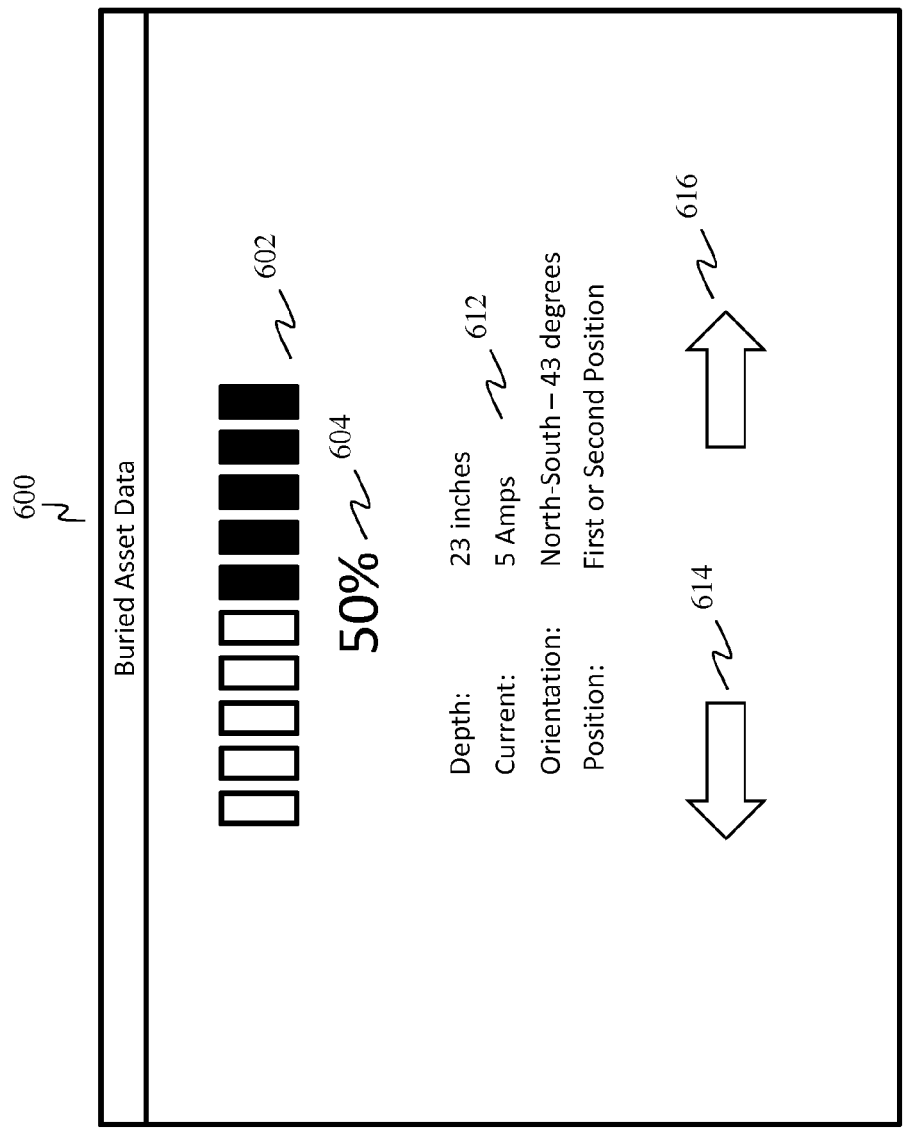
FIG. 6A is an illustration of a graphical user interface that displays data associated with the generation of buried asset data, according to an example embodiment.

FIG. 6A is an illustration of a graphical user interface 600 that displays data associated with the detection of buried asset data, according to an example embodiment. The graphical user interface 600 may apply to the device and systems illustrated in FIGS. 2A-5. The interface 600 may display buried asset data 612. Recall that buried asset data may include depth, position, electrical signal measurement (such as current, resistance, impedance, magnitude, frequency, voltage, etc.), direction and orientation.

Interface 600 may also include a graphic 602 that indicates the signal strength of the buried asset being detected (such as a meter reading comprising ten bars), and a numerical indicator 604 that indicates the signal strength of the buried asset being detected. In one embodiment, the device receives human readable buried asset data and based on the data received, the device calculates the appropriate graphic 602 or numerical indicator 604 to display in interface 600. For example, if a device receives human readable buried asset data indicating 50% signal strength, the device calculates the appropriate graphic 502 to display in interface 500 is five out of ten bars, which graphically indicates 50%. The interface 600 can also include the position the device is in based upon the reading of the position sensing device so that the technician can confirm that the correct algorithm, process, software, filter etc. is applied to the data received by the sensors 230.

Lastly, the interface 600 may also include left and right arrows 614, 616, which points the technician in the direction of the location of the buried asset being detected. Left and right arrows 614, 616, may additionally indicate to the technician the direction in which the system or device should be moved in order to read increased signal strength from of the buried asset being detected.

Figure 6B:
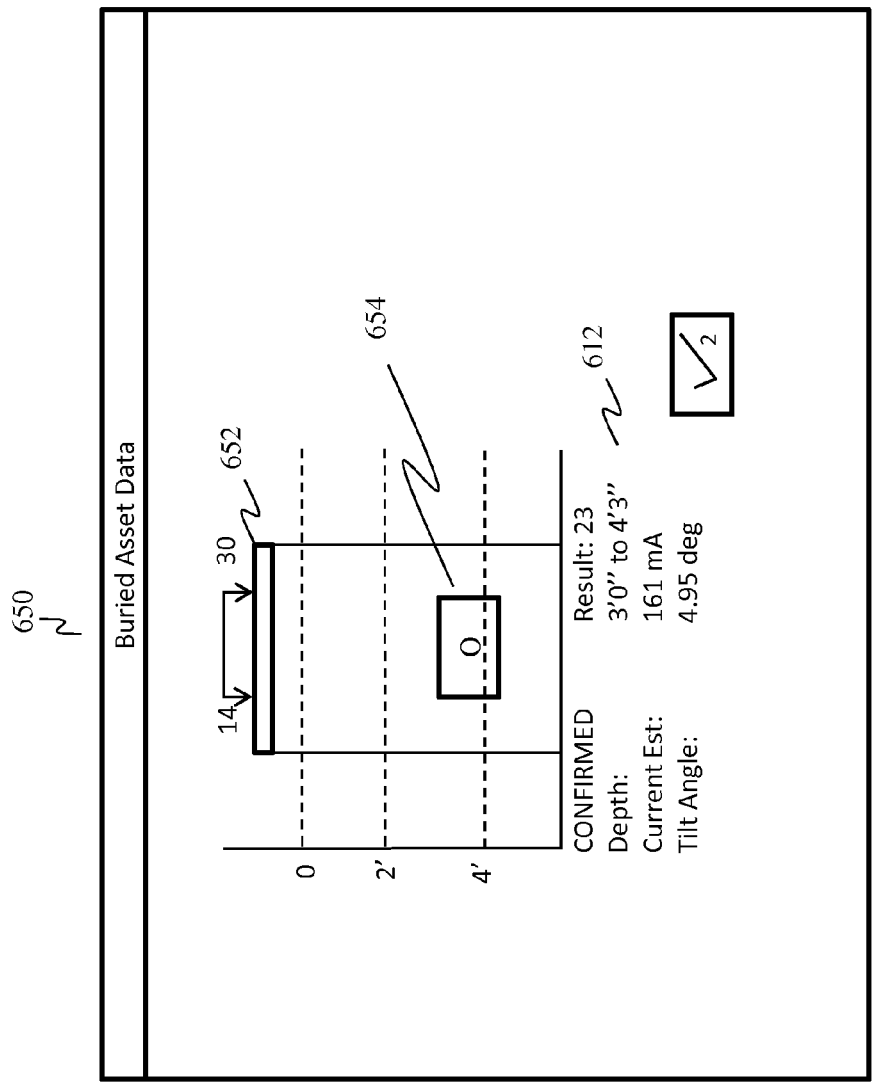
FIG. 6B is an illustration of an alternative graphical user interface that displays data associated with the generation of buried asset data, according to an example embodiment; and, FIG. 7 is a block diagram of a system including an example computing device and other computing devices.

FIG. 6B is an illustration of an alternative graphical user interface 650 that displays data associated with the detection of buried asset data, according to an example embodiment. The graphical user interface 650 may apply to the device and systems illustrated in FIGS. 2A-5. The interface 650 may display buried asset data 612. The interface 650 also shows a graphic 652 that indicates the position of a horizontally oriented locator device on the ground 103. Under the graphic 652 is a numbered graph that corresponds to the ground 103 and the depth of said ground. The interface 650 also shows a graphic 654 that indicates the position of a buried asset under the ground 103.

Figure 7:
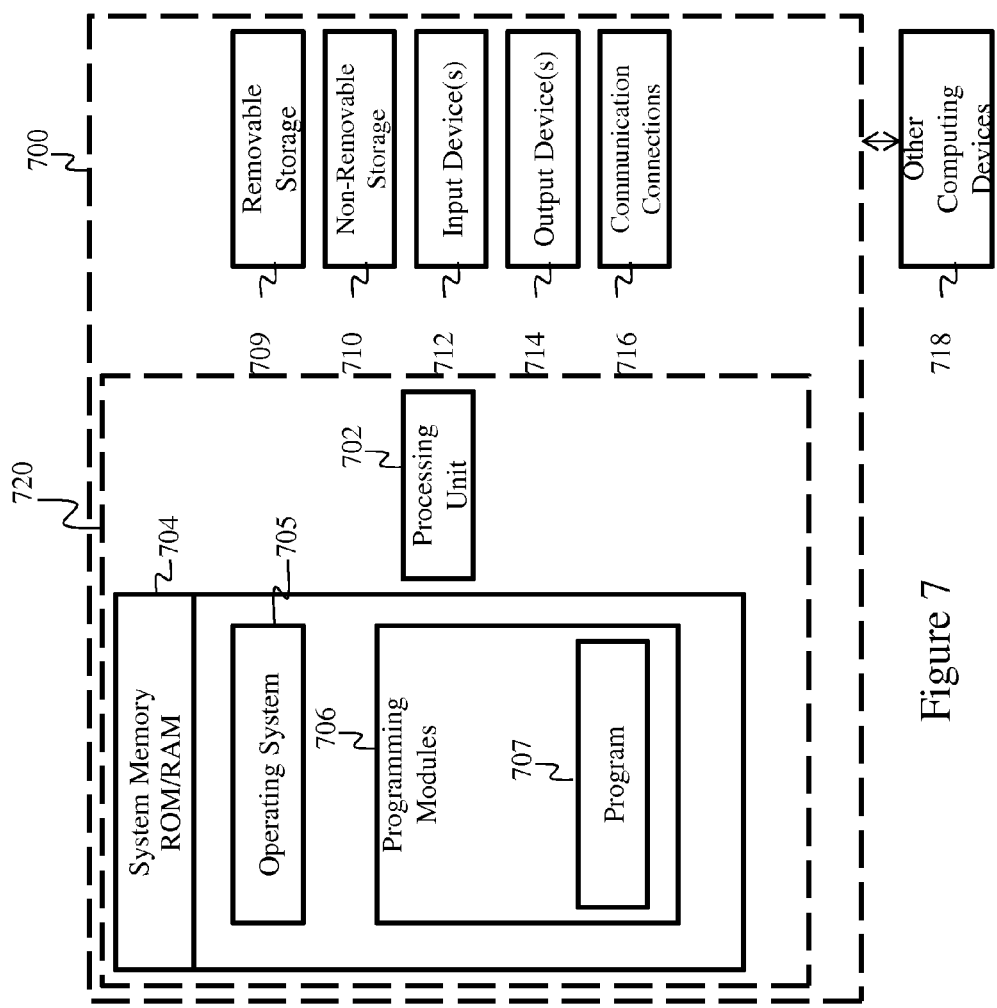

FIG. 7 is a block diagram of a system including an example computing device 700 and other computing devices. Consistent with the embodiments described herein, the aforementioned actions performed by devices 200, 260, 270, as well as any processors included therein, may be implemented in a computing device, such as the computing device 700 of FIG. 7. Any suitable combination of hardware, software, or firmware may be used to implement the computing device 700. The aforementioned system, device, and processors are examples and other systems, devices, and processors may comprise the aforementioned computing device. Furthermore, computing device 700 may comprise an operating environment for devices and systems, as described above. Process 700 may operate in other environments and are not limited to computing device 700.

With reference to FIG. 7, a system consistent with an embodiment of the invention may include a plurality of computing devices, such as computing device 700. In a basic configuration, computing device 700 may include at least one processing unit 702 and a system memory 704. Depending on the configuration and type of computing device, system memory 704 may comprise, but is not limited to, volatile (e.g. random access memory (RAM)), non-volatile (e.g. read-only memory (ROM)), flash memory, or any combination or memory. System memory 704 may include operating system 705, and one or more programming modules 706. Operating system 705, for example, may be suitable for controlling computing device 700's operation. In one embodiment, programming modules 706 may include, for example, a program module 707 for executing the actions of the device. Furthermore, embodiments of the invention may be practiced in conjunction with a graphics library, other operating systems, or any other application program and is not limited to any particular application or system. This basic configuration is illustrated in FIG. 7 by those components within a dashed line 720.

Computing device 700 may have additional features or functionality. For example, computing device 700 may also include additional data storage devices (removable and/or non-removable) such as, for example, magnetic disks, optical disks, or tape. Such additional storage is illustrated in FIG. 7 by a removable storage 709 and a non-removable storage 710. Computer storage media may include volatile and nonvolatile, removable and non-removable media implemented in any method or technology for storage of information, such as computer readable instructions, data structures, program modules, or other data. System memory 704, removable storage 709, and non-removable storage 710 are all computer storage media examples (i.e. memory storage.) Computer storage media may include, but is not limited to, RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store information and which can be accessed by computing device 700. Any such computer storage media may be part of device 700. Computing device 700 may also have input device(s) 712 such as a keyboard, a mouse, a pen, a sound input device, a camera, a touch input device, etc. Output device(s) 714 such as a display, speakers, a printer, etc. may also be included. The aforementioned devices are only examples, and other devices may be added or substituted.

Computing device 700 may also contain a communication connection 716 that may allow device 700 to communicate with other computing devices 718, such as over a network in a distributed computing environment, for example, an intranet or the Internet. Communication connection 716 is one example of communication media. Communication media may typically be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media. The term computer readable media as used herein may include both computer storage media and communication media.

As stated above, a number of program modules and data files may be stored in system memory 704, including operating system 705. While executing on processing unit 702, programming modules 706 (e.g. program module 707) may perform processes including, for example, one or more of the stages of the process of FIG. 5 as described above. The aforementioned processes are examples, and processing unit 702 may perform other processes. Other programming modules that may be used in accordance with embodiments of the present invention may include electronic mail and contacts applications, word processing applications, spreadsheet applications, database applications, slide presentation applications, drawing or computer-aided application programs, etc.

Generally, consistent with embodiments of the invention, program modules may include routines, programs, components, data structures, and other types of structures that may perform particular tasks or that may implement particular abstract data types. Moreover, embodiments of the invention may be practiced with other computer system configurations, including hand-held devices, multiprocessor systems, microprocessor-based or programmable consumer electronics, minicomputers, mainframe computers, and the like. Embodiments of the invention may also be practiced in distributed computing environments where tasks are performed by remote processing devices that are linked through a communications network. In a distributed computing environment, program modules may be located in both local and remote memory storage devices.

Furthermore, embodiments of the invention may be practiced in an electrical circuit comprising discrete electronic elements, packaged or integrated electronic chips containing logic gates, a circuit utilizing a microprocessor, or on a single chip (such as a System on Chip) containing electronic elements or microprocessors. Embodiments of the invention may also be practiced using other technologies capable of performing logical operations such as, for example, AND, OR, and NOT, including but not limited to mechanical, optical, fluidic, and quantum technologies. In addition, embodiments of the invention may be practiced within a general purpose computer or in any other circuits or systems.

Embodiments of the present invention, for example, are described above with reference to block diagrams and/or operational illustrations of methods, systems, and computer program products according to embodiments of the invention. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While certain embodiments of the invention have been described, other embodiments may exist. Furthermore, although embodiments of the present invention have been described as being associated with data stored in memory and other storage mediums, data can also be stored on or read from other types of computer-readable media, such as secondary storage devices, like hard disks, floppy disks, or a CD-ROM, or other forms of RAM or ROM. Further, the disclosed methods' stages may be modified in any manner, including by reordering stages and/or inserting or deleting stages, without departing from the invention.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method of locating a buried asset by a locator device, the locator device generating buried asset data, the locator device comprising at least two sensing units pivotally attached to a central unit housing a processor, each sensing unit comprising an elongated housing accommodating at least one sensor, wherein each sensor is for reading a plurality of analog radio frequency (RF) signals from the buried asset, wherein the sensing units are configured to be pivoted from a first vertical position to a second horizontal position and from the second horizontal position to the first vertical position, the locator device further comprising a position sensing device for sensing the first vertical position and the second horizontal position of the sensing units, the method comprising: determining, by the processor, whether the sensing units are in the first vertical position or the second horizontal position; reading, by the processor, via the sensors of the sensing units, a plurality of analog RF signals from the buried asset; applying, by the processor, a position filtering process to the analog RF signals based on the position; converting, by the processor, the analog RF signals into a plurality of digital signals comprising buried asset data corresponding to the buried asset, wherein the buried asset data includes depth data, position data and electrical current data for the buried asset; and, displaying, by the processor, the buried asset data in a graphical user interface of a display, wherein the buried asset data corresponds to the plurality of analog RF signals that were read.

2. The method of claim 1, further comprising a step before the step of reading of:
   performing, by the processor, a pre-amplification process upon the plurality of analog RF signals.

3. The method of claim 2, further comprising:
   performing, by the processor, an amplification process upon the plurality of analog RF signals after the pre-amplification process.

4. The method of claim 3, wherein the step of amplifying the plurality of analog RF signals further comprises performing, by the processor, a filtering process to remove noise.

5. The method of claim 3, wherein the processor further converts the plurality of analog RF signals to a plurality of digital signals and applies a digital signal processing step to the plurality of digital signals.

6. The method of claim 5, wherein the step of displaying the buried asset data further comprises:
   generating, by the processor, a graphic corresponding to a magnitude of one of the buried asset data.

* * * * *